(12) United States Patent
Brabant et al.

(10) Patent No.: US 9,218,962 B2
(45) Date of Patent: *Dec. 22, 2015

(54) LOW TEMPERATURE EPITAXY OF A SEMICONDUCTOR ALLOY INCLUDING SILICON AND GERMANIUM EMPLOYING A HIGH ORDER SILANE PRECURSOR

(71) Applicants: GLOBALFOUNDRIES INC., Grand Cayman (KY); Matheson Tri-Gas, Inc., Basking Ridge, NJ (US)

(72) Inventors: Paul D. Brabant, Scodack, NY (US); Keith Chung, Guilderland, NY (US); Hong He, Schenectady, NY (US); Devendra K. Sadana, Pleasantville, NY (US); Manabu Shinriki, Longmont, CO (US)

(73) Assignees: GLOBALFOUNDRIES INC., Grand Cayman (KY); MATHESON TRI-GAS, INC., Basking Ridge, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/057,064

(22) Filed: Oct. 18, 2013

(65) Prior Publication Data

US 2014/0045324 A1  Feb. 13, 2014

Related U.S. Application Data

(63) Continuation-in-part of application No. 13/475,503, filed on May 18, 2012, now Pat. No. 8,642,454.

(60) Provisional application No. 61/487,795, filed on May 19, 2011.

(51) Int. Cl.
*H01L 21/36* (2006.01)
*H01L 21/20* (2006.01)
(Continued)

(52) U.S. Cl.
CPC .......... *H01L 21/02532* (2013.01); *C30B 25/02* (2013.01); *C30B 29/52* (2013.01); *H01L 21/0262* (2013.01); *H01L 21/02573* (2013.01); *H01L 21/02636* (2013.01)

(58) Field of Classification Search
CPC ..................... H01L 21/02532; H01L 21/0262
USPC .................................................. 438/481, 478
See application file for complete search history.

(56) References Cited

U.S. PATENT DOCUMENTS

| | | |
|---|---|---|
| 5,378,651 A | 1/1995 | Agnello et al. |
| 5,876,796 A | 3/1999 | Regolini et al. |

(Continued)

FOREIGN PATENT DOCUMENTS

| | | |
|---|---|---|
| CN | 101106079 A | 1/2008 |
| CN | 101866834 A | 10/2010 |
| KR | 1020080114608 A | 12/2008 |

OTHER PUBLICATIONS

Tamura, N. et al., "45 nm CMOS Technology with Low Temperature Selective Epitaxy of SiGe" Applied Surface Science (Jul. 30, 2008) pp. 6067-6071, vol. 254, issue 19.

(Continued)

*Primary Examiner* — Luan C Thai
(74) *Attorney, Agent, or Firm* — Scully, Scott, Murphy & Presser P.C.

(57) ABSTRACT

A high order silane having a formula of $Si_nH_{2n+2}$, in which n is an integer greater than 3, in combination with a germanium precursor gas is employed to deposit an epitaxial semiconductor alloy material including at least silicon and germanium on a single crystalline surface. The germanium precursor gas effectively reduces the gas phase reaction of the high order silane, thereby improving the thickness uniformity of the deposited epitaxial semiconductor alloy material. The combination of the high order silane and the germanium precursor gas provides a high deposition rate in the Frank-van der Merwe growth mode for deposition of a single crystalline semiconductor alloy material.

19 Claims, 4 Drawing Sheets

(51) Int. Cl.
*H01L 21/02* (2006.01)
*C30B 25/02* (2006.01)
*C30B 29/52* (2006.01)

(56) References Cited

U.S. PATENT DOCUMENTS

| | | | |
|---|---|---|---|
| 5,906,680 A | 5/1999 | Meyerson | |
| 7,118,929 B2 | 10/2006 | Frayssinet et al. | |
| 7,132,338 B2 * | 11/2006 | Samoilov et al. | 438/300 |
| 7,166,528 B2 * | 1/2007 | Kim et al. | 438/607 |
| 7,687,383 B2 * | 3/2010 | Bauer | 438/510 |
| 7,851,309 B2 | 12/2010 | Leslie | |
| 7,863,163 B2 | 1/2011 | Bauer | |
| 8,212,259 B2 | 7/2012 | Flynn et al. | |
| 2002/0160587 A1 | 10/2002 | Jagannathan et al. | |
| 2006/0071213 A1 | 4/2006 | Ma et al. | |
| 2009/0108291 A1 | 4/2009 | Cheng et al. | |
| 2012/0024223 A1 | 2/2012 | Torres, Jr. et al. | |

OTHER PUBLICATIONS

Ghani, T. et al., "A 90nm High Volume Manufacturing Logic Technology Featuring Novel 45 nm Gate Length Strained Silicon CMOS Transistors" Portland Technology Development, TCAD, QRE, Intel Corp., Electron Devices Meeting-Tech Digest (Dec. 8-10, 2003) Hillsboro, OR.

Sturm, J.C. et al., "Chemical Vapor Deposition Epitaxy of Silicon-based Materials Using Neopentasilane" ECS Transactions (Oct. 2008) pp. 799-805, vol. 16, No. 10.

Bogumilowicz, Y. et al., "Chemical Vapour Etching of Si, SiGe and Ge with HCl; Applications to the Formation of Thin relaxed SiGe Buffers and to the Revelation of Threading Dislocations" Semiconductor Science Technology (Feb. 2005) pp. 127-134, vol. 20, issue 2.

Hartmann, J.M. et al., "Effect of HCl on the SiGe Growth Kinetics in Reduced Pressure-Chemical Vapor Deposition" Journal of Crystal Growth (May 2002) pp. 93-100, vol. 241.

Kamins, T.I. et al., "Kinetics of Selective Epitaxial Deposition of Si1—xGex" Applied Physics Letters (Aug. 10, 1992) pp. 669-671, vol. 61, No. 6.

Song, Y.J. et al., "High transconductance modulation-doped SiGe pMOSFETs by RPCVD" Electronics Letters (Nov. 7, 2002) pp. 1479-1480, vol. 38, No. 23.

Eberl, K. et al., "Boron Doping in Si-MBE" MRS Proceedings (Jan. 1991), vol. 220.

\* cited by examiner

LOW TEMPERATURE EPITAXY OF A SEMICONDUCTOR ALLOY INCLUDING SILICON AND GERMANIUM EMPLOYING A HIGH ORDER SILANE PRECURSOR

RELATED APPLICATIONS

The present application is a continuation-in-part application of, and claims the benefit of priority from, U.S. patent application Ser. No. 13/475,503 filed on May 18, 2012, the entire contents of which are incorporated herein by reference.

BACKGROUND

The present disclosure generally relates to a method of forming semiconductor structures, and more particularly to a method for low temperature selective epitaxy of a semiconductor alloy including at least silicon and germanium employing a high order silane precursor.

High order silanes refer to $Si_nH_{2n+2}$, in which n is an integer greater than 3. Chemical vapor deposition processes employing a high order silane can provide higher deposition rates and lower deposition temperatures compared to chemical vapor deposition processes employing silane or disilane. Gas phase reaction that forms silicon particulates in the gas phase is responsible for such high deposition rates and low deposition temperatures of chemical vapor deposition processes employing a high order silane.

For epitaxial silicon deposition processes, chemical vapor deposition processes employing a high order silane are not suitable because the gas phase reaction that is responsible for enhanced growth rates is also responsible for formation of gas phase silicon particulates and incorporation into a deposited film as a defect that degrades the crystallinity of the deposited film. In other words, the deposited silicon film becomes embedded with polycrystalline silicon grains and epitaxial alignment with an underlying single crystalline material is lost in the deposited film. For this reason, high order silanes are avoided in epitaxial deposition processes for silicon.

SUMMARY

A high order silane having a formula of $Si_nH_{2n+2}$, in which n is an integer greater than 3, in combination with a germanium precursor gas is employed to deposit an epitaxial semiconductor alloy material including at least silicon and germanium on a single crystalline surface. The germanium precursor gas effectively reduces the gas phase reaction of the high order silane, thereby improving the thickness uniformity of the deposited epitaxial semiconductor alloy material. The combination of the high order silane and the germanium precursor gas provides a high deposition rate in the Frank-van der Merwe growth mode for deposition of a single crystalline semiconductor alloy material. The deposition process can be combined with an etch process to provide a selective deposition of the epitaxial semiconductor alloy material. An etch chemistry employing a combination of hydrogen chloride and a germanium hydride can be employed to provide an effective etch process at low temperatures. A cyclic deposit and etch (CDE) process can employ an alternating sequence of deposition processes and etch processes.

According to an aspect of the present disclosure, a method for depositing a semiconductor alloy material by performing a set of at least one processing step at least once is provided. The set of at least one processing step includes a deposition step that deposits a semiconductor alloy material including at least silicon and germanium on a substrate by flowing a high order silane gas having a chemical formula of $Si_nH_{2n+2}$ and a germanium precursor gas as reactant gases into a process chamber including the substrate, wherein n is an integer greater than 3.

DETAILED DESCRIPTION

Figure 1:
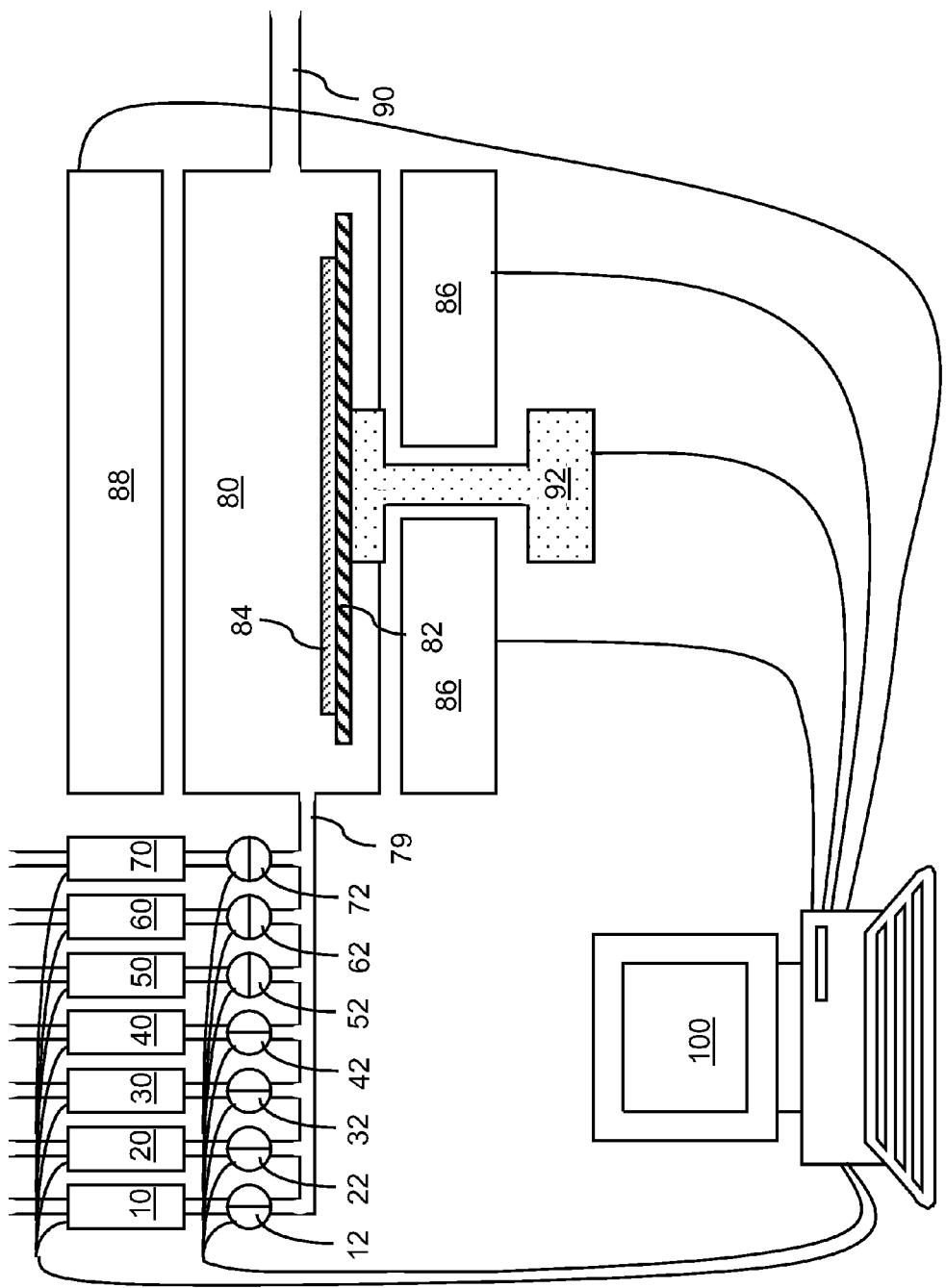
FIG. 1 is a schematic diagram illustrating an exemplary apparatus configured for silicon germanium selective epitaxy process employing cyclic deposit and etch (CDE) during a deposition step according to an embodiment of the present disclosure.

As stated above, the present disclosure relates to a method for low temperature selective epitaxy of a semiconductor alloy including at least silicon and germanium employing a high order silane precursor. Aspects of the present disclosure are now described in detail with accompanying figures. It is noted that like reference numerals refer to like elements across different embodiments. The drawings are not necessarily drawn to scale.

Figure 2:
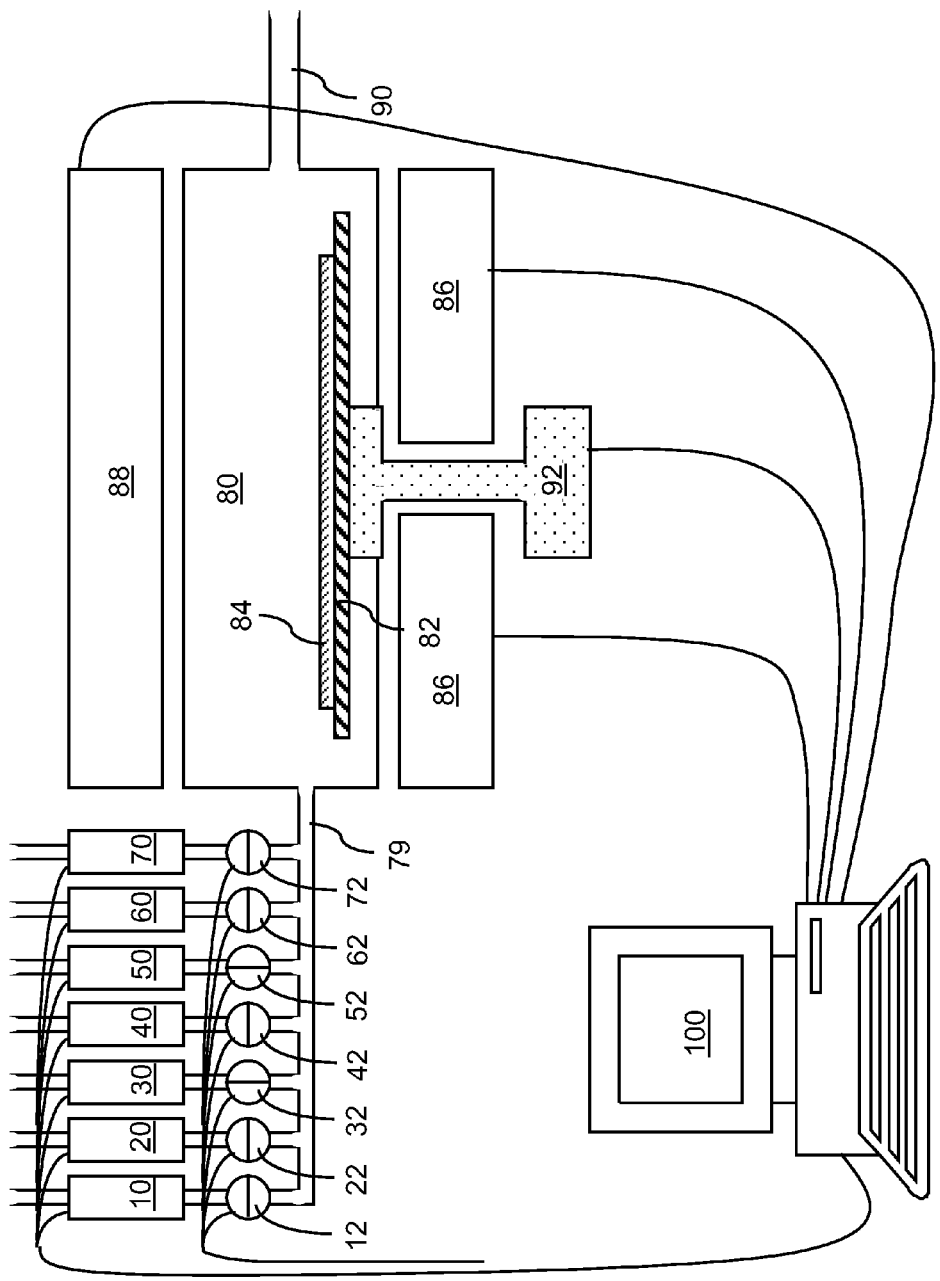
FIG. 2 is a schematic diagram illustrating an exemplary apparatus configured for silicon germanium selective epitaxy process employing cyclic deposit and etch (CDE) during an etch step according to an embodiment of the present disclosure.

Referring to FIGS. 1 and 2, an exemplary apparatus configured for a silicon germanium deposition process is illustrated. In one embodiment, the silicon germanium deposition process can be a silicon germanium epitaxy process in which a single crystalline semiconductor alloy material including at least silicon and germanium is deposited on a single crystalline surface of an underlying material layer. In one embodiment, the semiconductor deposition process can be a selective semiconductor alloy deposition process in which a silicon germanium alloy material or a silicon germanium carbon alloy material is deposited only on semiconductor surfaces, and is not deposited on a dielectric surface. In one embodiment, the selective semiconductor alloy deposition process can be performed employing a cyclic deposit and etch (CDE) process in which a sequence of processing steps are performed multiple times and each sequence of processing steps includes at least a deposition step and an etch step. In one embodiment, the selective semiconductor alloy deposition process can be a selective semiconductor epitaxy process in which a single crystalline silicon germanium alloy material or a single crystalline silicon germanium carbon alloy is grown directly on a single crystalline surface, such as a surface of single crystalline silicon or a single crystalline silicon-containing alloy, while no semiconductor alloy is deposited on dielectric surfaces.

The semiconductor alloy deposition process of the present disclosure can include only a single deposition step, a combination of a deposition step and an etch step, or multiple repetitions of a sequence of processing steps that include a deposition step and an etch step.

FIG. 1 shows the exemplary apparatus during a deposition step. In embodiments that employ at least one etch step, the configuration of the exemplary apparatus during an etch step is illustrated in FIG. 2. A semiconductor alloy deposition process that employs only a deposition step can be performed employing only the configuration illustrated in FIG. 1. A semiconductor alloy deposition process that employs at least one deposition step and at least one etch step can be performed employing the configurations illustrated in FIGS. 1 and 2. The CDE semiconductor selective deposition process can employ deposition steps and etch steps alternately to provide selectivity of growth of a semiconductor alloy material on semiconductor surfaces, while preventing cumulative deposition of any semiconductor alloy material on dielectric surfaces such as surfaces of a silicon oxide surfaces and silicon nitride surfaces of a patterned substrate. If the CDE semiconductor selective deposition process is a CDE semiconductor selective epitaxy process that deposits a single crystalline semiconductor alloy material, the CDE semiconductor selective epitaxy process can employ deposition steps and etch steps alternately to provide selectivity of growth of a single crystalline epitaxial semiconductor alloy material on single crystalline surfaces of a semiconductor substrate, while preventing cumulative deposition of an amorphous or polycrystalline semiconductor alloy material on dielectric surfaces such as surfaces of a silicon oxide surfaces and silicon nitride surfaces of a patterned semiconductor substrate.

The exemplary apparatus is configured to provide process gases, etch gases, and purge gases to a process chamber 80, which can be configured as a reduced pressure process chamber configured to operate in a pressure range from 1 Torr and 300 Torr during deposition steps and etch steps. An inlet gas manifold 79 is provided on one side of the process chamber 80, and an exhaust manifold 90 is provided on the other side of the process chamber 80. The exhaust manifold 90 is connected to a vacuum pump (not shown) and a scrubber (not shown). Alternatively, the process chamber 80 can be configured to operate at, or close to, atmospheric pressure (760 Torr).

A susceptor 82 is located in the process chamber 80. The susceptor 82 is configured to hold a wafer 84, which is a semiconductor substrate such as a blanket silicon substrate or a patterned substrate including single crystalline silicon portions. In one embodiment, the susceptor 82 can have a thermal mass greater than the thermal mass of the wafer 84 to facilitate heating of the wafer 84 once the wafer is placed on the susceptor. In one embodiment, the susceptor 84 can be configured to rotate while holding the wafer 84, thereby providing a rotation to the wafer 84 to enhance the uniformity of the silicon germanium film or the silicon germanium carbon film deposited on the wafer 84.

The process chamber 80 can have a transparent enclosure to let in radiation from external heating elements. A lower temperature control unit 86 and an upper temperature control unit 88 can be provided below, and above, the process chamber 80, respectively. Each of the lower temperature control unit 86 and the upper temperature control unit 88 can include heating elements, a pyrometer, and a temperature control feedback circuitry designed to control the power supplied to the heating elements in order to stabilize the temperature of the susceptor 82 and the wafer 84 at a target temperature.

The exemplary apparatus can be configured to provide a carrier gas to the process chamber 80 through a first mass flow controller (MFC) 10 and a first valve 12. The first valve 12 is normally closed, and is opened when the carrier gas flows into the process chamber 80. The first MFC 10 controls the flow rate of the carrier gas into the process chamber 80. In one embodiment, the first MFC 10 can be configured to provide a flow rate in a range from 1 standard liter per minute (slm) to 1,000 slm. The carrier gas can be, for example, hydrogen gas, helium gas, nitrogen gas, argon gas, or a combination thereof.

Process gases can include a high order silane gas that is provided into the process chamber 80 through a second MFC 20 and a second value 22 from a high order silane source. As used herein, a "high order silane" refers to $Si_nH_{2n+2}$ compounds in which n is greater than 3. For example, high order silanes that can be employed for the purposes of the present disclosure include $Si_4H_{10}$, $Si_5H_{12}$, $Si_6H_{14}$, $Si_7H_{16}$, $Si_8H_{18}$, $Si_9H_{20}$, etc. The high order silane gas source can be a bubbler that is configured to provide a vapor of the high order silane in a carrier gas, which can be, for example, hydrogen gas, helium gas, nitrogen gas, argon gas, or a combination thereof. The vapor pressure of the high order silane gas can be controlled within a target range by controlling the temperature of the bubbler. The second shut-off valve 22 is normally closed, and is opened when the high order silane gas flows into the process chamber 80. In one embodiment, the second MFC 20 can be configured to provide a flow rate in a range from 10 standard cubic centimeters per minute (sccm) to 10 slm.

A germanium precursor gas can be provided into the process chamber 80 through a third MFC 30 and a third value 32 from a germanium precursor gas source. The germanium precursor gas can be germane ($GeH_4$) or digermane ($Ge_2H_6$) or germanium tetrachloride ($GeCl_4$). The germanium precursor gas can be provided from a compressed gas tank. The third shut-off valve 32 is normally closed, and is opened when the germanium precursor gas flows into the process chamber 80. In one embodiment, the third MFC 30 can be configured to provide a flow rate in a range from 10 sccm to 10 slm.

Optionally, a dopant gas can be provided into the process chamber 80 through a fourth MFC 40 and a fourth value 42 from a dopant gas source, which can be a compressed gas tank. The dopant gas can be diborane ($B_2H_6$), phosphine ($PH_3$), arsine ($AsH_3$), or stibine ($SbH_3$). In one embodiment, the dopant gas can be diborane. The fourth shut-off valve 42 is normally closed, and is opened when the dopant gas flows into the process chamber 80. In one embodiment, the fourth MFC 40 can be configured to provide a flow rate in a range from 1 sccm to 1 slm.

In embodiments in which the semiconductor alloy deposition process employs at least one etch step, hydrogen chloride (HCl) gas can be provided into the process chamber 80 through a fifth MFC 50 and a fifth value 52 from a hydrogen chloride source, which can be a compressed tank including hydrogen chloride. The fifth shut-off valve 52 is normally closed, and is opened when the germanium-containing gas flows into the process chamber 80. In one embodiment, the fifth MFC 50 can be configured to provide a flow rate in a range from 100 sccm to 100 slm.

A purge gas can be provided into the process chamber 80 through a sixth MFC 60 and a sixth value 62 from a purge gas source, which can be a compressed tank including the purge gas. The purge gas can be nitrogen or hydrogen. The sixth shut-off valve 62 is normally open, and is closed when the purge gas does not flow into the process chamber 80. In one embodiment, the sixth MFC 60 can be configured to provide a flow rate in a range from 100 sccm to 100 slm.

Optionally, a germanium-containing gas that is different from the germanium precursor can be provided into the process chamber 80 through a seventh MFC 70 and a seventh value 72 from a germanium-containing gas source. The germanium-containing gas can be, for example, germanium tetrachloride ($GeCl_4$) or germanium tetrafluoride ($GeF_4$). Alternately, if the germanium source gas one of germane ($GeH_4$) and digermane ($Ge_2H_6$), the germanium-containing gas can be the other of germane and digermane. The germanium-containing gas can be provided from a compressed gas tank, or can be provided by any other alternate means for providing the germanium-containing gas as known in the art. The seventh shut-off valve 72 is normally closed, and is opened when the germanium-containing gas flows into the process chamber 80. In one embodiment, the seventh MFC 70 can be configured to provide a flow rate in a range from 10 sccm to 10 slm.

The wafer 84 can be any substrate known in the art. In one embodiment, the wafer 84 can be an unpatterned semiconductor substrate or a patterned semiconductor substrate including at least one physically exposed semiconductor surface and at least one physically exposed dielectric surface. In one embodiment, the wafer 84 can include at least one physically exposed silicon surface and at least one physically exposed dielectric surface. In a CDE semiconductor selective deposition, a deposition step and an etch step can be alternately performed in each cycle, which is repeated multiple times.

A susceptor motion control assembly 92 can be provided to move the susceptor 82 during the deposition step and etch steps. The susceptor motion control assembly 92 can be configured to rotate the susceptor around the center axis of the susceptor 82, thereby rotating the wafer 82 during the deposition steps and the etch steps. In one embodiment, the susceptor motion control assembly 92 can include a motor located outside a vacuum enclosure of the process chamber 80, a magnetic coupling device, and a rotation axis structure connected to the susceptor 82 and attached to inner components of the magnetic coupling device. The susceptor motion control assembly 92 can rotate the wafer 84, for example, at a rate from 0.2 revolution per minute (rpm) to 60 rpm.

The exemplary apparatus can further include a process control device 100, which can be a computer, a set of interconnected computers, a dedicated standalone computing device, a portable computing device, or any other type of device capable of controlling the pressure and temperature of the process chamber 80 and the gas flow into the process chamber 80 by activating each of the valves (12, 22, 32, 42, 52, 62, 72) and the MFC's (10, 20, 30, 40, 50, 60, 70). Further, the process control device 100 can be configured to run a process control program, or a "process recipe," that specifies target process parameters for performing each of the deposition steps and each of the etch steps. For example, the process control program can include specifications for target temperatures, target pressures, and target gas flow rates for each of the gases controlled by the valves (12, 22, 32, 42, 52, 62, 72) and the MFC's (10, 20, 30, 40, 50, 60, 70) at each stage of the deposition steps and at each stage of the etch steps. In one embodiment, the process control device can be configured to perform the plurality of deposition steps and the plurality of etch steps as a series of alternately performed deposition steps and etch steps.

Referring to FIG. 1, during each deposition step, an undoped or doped silicon germanium alloy material or an undoped or doped silicon germanium carbon alloy material is formed on the wafer. The second shut-off value 22 and the third shut-off value 32 are opened, and the second MFC 20 and the third MFC 30 are controlled to allow simultaneous flow of the high order silane gas and the germanium precursor gas into the process chamber 80. Optionally, the first shut-off value 12 can be opened and the first MFC 10 can be controlled to allow the carrier gas to flow into the process chamber with the combination of the high order silane gas and the germanium precursor gas. The combination of the high order silane gas and the germanium precursor gas can be employed deposit a high quality semiconductor alloy including at least silicon and germanium at a high growth rate at low temperatures. The high order silane is employed as the silicon precursor, and germane or digermane can be employed as the germanium precursor. Optionally, the first shut-off value 12 can be opened and the first MFC 10 can be controlled to allow the carrier gas to flow into the process chamber with the at least one precursor gas. The temperature of the wafer 84 during the deposition step can be in a range from, and including, 380° C. to, and including, 600° C.

In one embodiment, a high quality semiconductor alloy can be deposited at a high growth rate at low temperatures through use of the combination of a high order silane gas and a germanium precursor gas. The high order silane is employed as the silicon precursor, and germane or digermane can be employed as the germanium precursor.

The high order silane gas and the germanium precursor gas can be delivered into the process chamber 80 with or without the carrier gas. The partial pressure of the high order silane gas during the deposition step can be from 0.1 mTorr to 10 Torr. The partial pressure of the germanium precursor gas during the deposition step can be from 0.1 mTorr to 10 Torr. The ratio of the partial pressure of the high order silane gas to the partial pressure of the germanium precursor gas can be from 0.001 to 1,000, although lesser and greater ratios can also be employed. The atomic percentage of germanium atoms relative to the total semiconductor atoms (i.e., the silicon atoms and the germanium atoms) in the deposited undoped or doped silicon alloy can be from nearly 0% to nearly 100%. Thus, the atomic percentage of germanium within the doped or undoped semiconductor alloy can be varied from 0% to 100% by adjusting the ratio of the flow rates of the high order silane gas and the germanium precursor gas, and by adjusting the deposition temperature and pressure during the deposition step.

The temperature of the wafer 84 during the deposition step can be in a range from, and including, 380° C. to, and including, 550° C. The use of the high order silane gas provides a significant increase in the deposition rate in the temperature range from, and including, 380° C. to, and including, 550° C. relative to a deposition process employing monosilane ($SiH_4$) or disilane ($Si_2H_6$). In one embodiment, the temperature of the wafer 84 during the deposition step can be in a range from, and including, 380° C. to, and including, 400° C. In yet another embodiment, the temperature of the wafer 84 during the deposition step can be not less than 380° C. and less than 400° C. The total pressure of the process chamber 80 during the deposition step can be from 3 Torr to 300 Torr, although lesser and greater pressures can also be employed.

The use of the high order silane gas provides a significant increase in the deposition rate in the temperature range from, and including, 400° C. to, and including, 550° C. relative to a deposition process employing monosilane ($SiH_4$) or disilane ($Si_2H_6$). While germane or digermane can be employed to provide a high deposition rate for a semiconductor alloy material, digermane can provide a higher deposition rate at the same temperature. In one embodiment, the deposition rate for single crystalline semiconductor alloy can be from 1 nm/min to 30 nm/min, although lesser and greater deposition rates can also be used. In another embodiment, the deposition rate for single crystalline semiconductor alloy can be from 5 nm/min to 30 nm/min. In yet another embodiment, the deposition rate for single crystalline semiconductor alloy can be from 10 nm/min to 30 nm/min.

While germane or digermane can be employed to provide a high deposition rate for a semiconductor, digermane can provide a higher deposition rate at the same temperature. In one embodiment, the deposition rate for single crystalline semiconductor can be from 1 nm/min to 30 nm/min, although lesser and greater deposition rates can also be used. In another embodiment, the deposition rate for single crystalline semiconductor can be from 5 nm/min to 30 nm/min. In yet another embodiment, the deposition rate for single crystalline semiconductor can be from 10 nm/min to 30 nm/min.

Portions of the undoped or doped semiconductor alloy material deposited on single crystalline semiconductor surfaces (such as single crystalline silicon surfaces) are epitaxially aligned to the underlying single crystalline semiconductor material, and become epitaxial semiconductor alloy portions including a silicon germanium alloy or a silicon germanium carbon alloy. Portions of the undoped or doped semiconductor alloy material deposited on dielectric surfaces (such as surfaces of silicon oxide or silicon nitride) and amorphous or polycrystalline semiconductor surfaces are formed as amorphous or polycrystalline becomes amorphous or polycrystalline semiconductor alloy portions.

The semiconductor alloy portions can be formed as undoped semiconductor alloy portions or doped semiconductor alloy portions having a p-type doping or an n-type doping. In one embodiment, the semiconductor alloy portions can be formed as undoped semiconductor alloy portions. In this case, the fourth shut-off value 42 is shut, and the fourth MFC 40 can be controlled not to allow any flow of the dopant gas.

In another embodiment, the semiconductor alloy portions can be formed as doped semiconductor alloy portions having a p-type doping or n-type doping. Deposition of boron-doped semiconductor alloy material can be performed by in-situ doping of the semiconductor alloy. For example, the semiconductor alloy portions can be formed as boron-doped (i.e., B-doped) semiconductor alloy portions. In this case, a dopant gas including boron such as diborane can be flowed into a reaction chamber concurrently with the silicon precursor and the germanium precursor. The fourth shut-off valve 42 is opened, and the fourth MFC can be controlled to flow the dopant gas into the process chamber 80.

In one embodiment, the dopant gas can be diborane, and the deposited semiconductor alloy material can be doped with boron at a boron concentration from $1.0 \times 10^{17}/cm^3$ to $3.0 \times 10^{21}/cm^3$, although lesser and greater boron concentrations can also be employed. In another embodiment, the deposited semiconductor alloy material can be doped with boron at a boron concentration from $1.0 \times 10^{19}/cm^3$ to $2.0 \times 10^{21}/cm^3$. In yet another embodiment, the deposited semiconductor alloy material can be doped with boron at a boron concentration from $1.0 \times 10^{20}/cm^3$ to $1.0 \times 10^{21}/cm^3$.

Referring to FIG. 2, during each etch step of a selective semiconductor alloy deposition process that includes at least one etch step, the undoped or doped semiconductor alloy material portions are etched from the wafer. The etch rate of the undoped or doped semiconductor alloy material is dependent on the crystalline structure. Specifically, single crystalline undoped or doped semiconductor alloy material is etched at a lower etch rate than amorphous or polycrystalline semiconductor alloy material. Thus, all amorphous or polycrystalline semiconductor alloy material deposited in the previous deposition cycle can be removed in the etch step, while a fraction of each epitaxial semiconductor alloy portion deposited during the previous deposition step remains on the wafer 82 at the end of each etch step.

The fifth shut-off value 52 and at least one of the third shut-off value 32 and the optional seventh shut-off valve 72 are opened, and the fifth MFC 50 and at least one of the third MFC 30 and the optional seventh MFC 70 are controlled to allow simultaneous flow of the hydrogen chloride gas and a germanium-containing gas into the process chamber 80. The germanium-containing gas that is flowed into the process chamber includes at least one of the germanium precursor gas that flows through the third MFC 30 and the germanium-containing gas that is different from the germanium precursor gas and flows through the optional seventh MFC 70. Thus, the germanium-containing can include at least of germane ($GeH_4$), digermane ($Ge_2H_6$), germanium tetrachloride ($GeCl_4$), and germanium tetrafluoride ($GeF_4$).

While the etch rate of hydrogen chloride at temperatures lower than 625° C. is negligible, the etch rate of the combination of hydrogen chloride and the germanium-containing gas that is simultaneously flowed into the process chamber 80 is significantly enhanced over the etch rate of hydrogen chloride at temperatures lower than 625° C. Without wishing to be bound by any theory, it is conjectured that the mechanism for significantly enhancing the etch rate and the germanium concentration may be the interaction of hydrogen chloride with the germanium-containing gas. Thus, addition of the germanium-containing gas enhances the etch rate during the etch step so as to provide a significant etch rate for semiconductors in the temperature range from 380° C. to 630° C. The germanium-containing gas can be, for example, germane ($GeH_4$), digermane ($Ge_2H_6$), germanium tetrachloride ($GeCl_4$), germanium tetrafluoride ($GeF_4$), or combinations thereof.

In one embodiment, the germanium-containing gas is the germanium precursor gas, and is provided through the third MFC 30 and the third valve 32. In this case, the germanium-containing gas employed during the etch step can be germane or digermane.

In another embodiment, the germanium-containing gas is the germanium-containing gas that is different from the germanium precursor gas, and is provided through the seventh MFC 70 and the seventh valve 72. In one case, the germanium precursor gas can be germane, and the germanium-containing gas flowed during the etch process can be digermane, germanium tetrachloride ($GeCl_4$), germanium tetrafluoride, or combinations thereof. In another case, the germanium precursor gas can be digermane, and the germanium-containing gas flowed during the etch process can be germane, germanium tetrachloride ($GeCl_4$), germanium tetrafluoride, or combinations thereof. In yet another case, the germanium precursor gas can be germanium tetrachloride, and the germanium-containing gas flowed during the etch process can be germane, digermane, germanium tetrafluoride, or combinations thereof.

In yet another embodiment, the germanium-containing gas can be a combination of the germanium precursor gas that is flowed through the third MFC 30 and the third valve 32 and another germanium-containing gas that is different from the germanium precursor gas, which is provided through the seventh MFC 70 and the seventh valve 72.

The partial pressure of the hydrogen chloride gas during the etch step can be from 1 Torr to 300 Torr. The partial pressure of the germanium-containing gas during the etch step can be from 0.1 mTorr to 10 Torr. The ratio of the partial pressure of the hydrogen chloride gas to the partial pressure of the germanium-containing gas can be from 10 to 100,000, although lesser and greater ratios can also be employed. The total pressure of the process chamber 80 during the etch step can be from about 1 Torr to 300 Torr, although lesser and greater pressures can also be employed.

The temperature of the wafer 84 during the etch step can be in a range from, and including, 380° C. to, and including, 630° C. In one embodiment, the temperature of the wafer 84 during the etch step can be in a range from, and including, 430° C. to, and including, 560° C. In yet another embodiment, the temperature of the wafer 84 during the etch step can be in a range from, and including, 460° C. to, and including, 540° C. In yet another embodiment, the temperature of the wafer 84 during the etch step can be in a range from, and including, 380° C. to, and including, 430° C. In yet another embodiment, the temperature of the wafer 84 during the etch step can be not less than 380° C. and less than 430° C.

In one embodiment, the temperature of the wafer 84 during the etch step can be the same as the temperature of the wafer 84 during the deposition step. In another embodiment, the temperature of the wafer 84 can be elevated during each etch step above the temperature of the deposition step, for example, by a temperature differential greater than 0° C. and less than 540° C. In one embodiment, the etch temperature can be higher than the deposition temperature by no more than 50° C.

A selectivity ratio is defined as the etch rate for an amorphous or polycrystalline film divided by the etch rate of an epitaxial film having a same composition as the amorphous or polycrystalline film. The use of a germanium-containing gas during the etch step provides a selectivity ratio greater than 1.0 at processing temperatures less than 580° C. In one embodiment, the use of a germanium-containing gas during the etch step provides a selectivity ratio greater than 1.0 for doped or undoped semiconductor alloy materials deposited and etched at a temperature at, or lower than, 550° C.

In one embodiment, selectivity ratios greater than 2.0 can be provided during the etch step. In another embodiment, selectivity ratios greater than 4.0 can be provided during the etch step. In yet another embodiment, selectivity ratios greater than 7.0 can be provided during the etch step.

The etch rate for single crystalline semiconductors of the etch process can be from 1 nm/min to 100 nm/min, although lesser and greater etch rates can also be employed. In one embodiment, the etch rate for single crystalline semiconductors of the etch process can be from 1 nm/min to 80 nm/min, although lesser and greater etch rates can also be employed. In another embodiment, the etch rate for single crystalline semiconductors of the etch process can be from 2 nm/min to 10 nm/min.

The deposited doped or undoped semiconductor alloy materials deposited on dielectric surfaces tend to become less amorphous and more polycrystalline with increasing deposition temperature. For a given germanium concentration in a semiconductor alloy material, the lower the deposition temperature, the greater the selectivity ratio and the greater the critical thickness beyond which a film of the semiconductor alloy material relaxes.

In one embodiment, an epitaxial semiconductor having a germanium concentration in a range from 0.01% to 60% in atomic concentration can be selectivity deposited in a temperature range from 380° C. to 550° C.

In one embodiment, a relatively small amount of hydrogen chloride can be flowed into the process chamber 80 during each deposition step. The presence of hydrogen chloride during the deposition step improves the quality of epitaxial semiconductor alloy material in terms of single crystallinity of the deposited semiconductor alloy material (i.e., the degree of alignment in the epitaxial semiconductor alloy material). This effect was experimentally confirmed by comparing X-ray diffraction spectra of a first epitaxial semiconductor alloy material deposited employing a deposition step in which hydrogen chloride was flowed with tetrasilane ($Si_4H_{10}$) and germane and a second epitaxial semiconductor alloy material deposited employing a deposition step in which hydrogen chloride was not flowed while tetrasilane and germane were flowed. Fringe peaks were present in the XRD spectra of the first epitaxial semiconductor alloy material, while fringe peaks were not present in the XRD spectra of the second epitaxial semiconductor alloy material.

In one embodiment, the flow rate of hydrogen chloride during each deposition step can be from 0.1% to 100% of the combined flow rate of the high order silane gas and the germanium precursor gas, although lesser and greater percentages can also be employed. In another embodiment, the flow rate of hydrogen chloride during each deposition step can be from 0.5% to 10% of the combined flow rate of the high order silane gas and the germanium precursor gas.

In embodiments in which germanium tetrachloride is employed as the germanium precursor gas, a uniform germanium concentration profile without any germanium pile-up was observed in doped or undoped epitaxial silicon germanium alloy materials or in doped or undoped epitaxial silicon germanium carbon alloy materials. It is conjectured that strong Si—Cl bonds prevents intermixing of germanium and silicon in this case.

In one embodiment, the methods of the present disclosure can be employed to embed epitaxial semiconductor alloys in a source and/or a drain region of a field effect transistor including a silicon channel to provide a compressive stress along the lengthwise direction of the channel, i.e., along the direction connecting the source region and the drain region of the field effect transistor. As used herein, a "field effect transistor" refers to any transistor that employs field effect to control the operation of the device, and includes metal-semiconductor-insulator (MOS) field effect transistors, junction field effect transistors, and all types of planar and fin-configuration variants thereof as known in the art.

Use of a high order silane for deposition of a silicon film is prone to generation of gas phase reaction products, which are silicon particulates that are incorporated into the silicon film as defects and degrades the crystalline quality of the deposited silicon film. For deposition of a single crystalline silicon material, therefore, the gas phase reaction of the high order silane must be suppressed.

In general, suppression of gas phase reaction of a high order silane can be achieved by increasing the flow speed of the high order silane within the process chamber. The increase of the flow speed of the high order silane can be achieved, for example, by decreasing the process pressure within the deposition step. However, reduction of the process pressure and increase in the flow speed of the high order silane results in reduction of deposition rate. For example, in a silicon deposition process performed at 550° C., reduction of the process pressure from 10 Torr to 2 Torr results in decrease of the silicon deposition rate by a factor of about 3.

In the course of the research leading to the present disclosure, it has been discovered that concurrent flow of a germanium-precursor gas during the flow of a high order silane can reduce the gas phase reaction of the high order silane significantly. For example, flowing germane at a flow rate sufficient incorporate germanium into a single crystalline semiconductor alloy film at 6% in atomic concentration in a semiconductor epitaxy process employing tetrasilane ($Si_4H_{10}$) and germanium ($GeH_4$) at 550° C. and 10 Torr of total pressure resulted in a decrease at least by a factor of 2 in the film roughness as measured in root mean square roughness measurement relative to a single crystalline silicon epitaxy process employing tetrasilane only and performed at 550° C. and 10 Torr of total pressure. Further, flowing germane at a flow rate sufficient incorporate germanium into a single crystalline silicon germanium alloy film at 28% in atomic concentration in a silicon germanium epitaxy process employing tetrasilane ($Si_4H_{10}$) and germanium ($GeH_4$) at 550° C. and 10 Torr of total pressure resulted in a decrease at least by a factor of 10 in the film roughness as measured in root mean square roughness measurement relative to a single crystalline silicon epitaxy process employing tetrasilane only and performed at 550° C. and 10 Torr of total pressure.

It has been well known that the growth of epitaxial thin films can be classified into three modes: Volmer-Weber (VW) growth mode, Frank-van der Merwe (FM) growth mode, and Stranski-Krastanov (SK) growth. In VW growth mode, adatom-adatom interactions are stronger than those of the adatom with the surface, leading to the formation of three-dimensional adatom clusters or islands. Growth of these clusters, along with coarsening, will cause rough multi-layer films to grow on the substrate surface. In the FM growth mode, the opposite of the phenomenon of the VW growth mode occurs. Adatoms attach preferentially to surface sites resulting in atomically smooth, fully formed layers. This layer-by-layer growth is two dimensional, indicating that complete films form prior to growth of subsequent layers. The SK growth mode is an intermediary process characterized by both two-dimensional layer and three-dimensional island growth. Transition from the layer-by-layer to island-based growth occurs at a critical layer thickness which is highly dependent on the chemical and physical properties, such as surface energies and lattice parameters, of the substrate and film.

When epitaxial deposition of single crystalline silicon is attempted employing a high order silane gas, the desirable FM growth mode can occur only when the total pressure is low and the velocity of the high order silane gas is sufficiently fast to enable the FM growth mode. However, the growth rate under such process conditions is impractically low, e.g., about 10 nm per minute at 550° C. and 2 Torr of total pressure.

When the total pressure of the process chamber is increased in order to increase the deposition rate of silicon, the deposition mode of silicon initially changes to the SK growth mode because gas phase reaction of the high order silane causes formation of silicon particulates within the gas stream and subsequent embedding of the silicon particulates within the deposited silicon film. As the film thickness increases, the SK growth mode may be maintained or the crystallinity of the deposited film may be lost resulting in deposition of a polycrystalline silicon in lieu of single crystalline silicon, depending on the density of the silicon particulates that are incorporated into the deposited silicon film.

Introduction of a germanium precursor gas into the gas stream including the high order silane has the effect of suppressing the gas phase reaction of the high order silane. Without significantly reducing the deposition rate of a semiconductor material, the germanium precursor gas enables deposition of a single crystalline semiconductor alloy material at a total pressure and temperature at which deposition of a single crystalline silicon material employing the high silane precursor (and without the germanium precursor gas) is impossible due to gas phase reactions.

Thus, at a total pressure and a temperature at which deposition of silicon from a high order silane gas cannot occur in the FM growth mode, flowing a combination of the germanium precursor gas concurrently with the flow of a high order silane enables deposition of a single crystalline semiconductor alloy material in the FM growth mode. In other words, at a total pressure and a temperature in which layer by layer deposition of silicon employing the high order silane cannot occur due to the high density of defects incorporated into the film, a layer by layer deposition process (which occurs only in the FM growth mode) can occur by flowing a combination of the germanium precursor gas concurrently with the flow of a high order silane.

Whether the growth mode of a semiconductor material is the FM growth mode or one of the SK growth mode and a polycrystalline growth mode can be determined by measuring the root mean square surface roughness of the deposited film. In general, root mean square surface roughness that does not exceed twice the thickness of a monolayer of the deposited semiconductor material is indicative of the FM growth mode, and root mean square surface roughness that exceeds the thickness of a monolayer of the deposited semiconductor material is indicative of a growth mode other than the FM growth mode.

Optionally, a carbon-containing precursor gas can be flowed into a process chamber concurrently with the high order silane gas and the germanium precursor gas to provide a selective deposition of a silicon germanium carbon alloy. In one embodiment, the silicon germanium-carbon alloy can be formed on a single crystalline substrate with epitaxial alignment to the underlying crystalline structure of the single crystalline substrate in a selective epitaxy process. In this case, the growth of the silicon germanium-carbon alloy can proceed in the FM growth mode by selecting a suitable flow level of the germanium precursor gas. For example, a compound including $Si_{1-x-y}Ge_xC_y$ in which y is in a range from 0.00001 to 0.02, and x is in a range from 0.05 to 0.99 can be formed in a single cycle deposition-etch epitaxy process, or a CDE epitaxial deposition process.

EXAMPLES

A study was performed employing a reduced pressure chemical vapor deposition (RPCVD) chamber configured to deposit a semiconductor on a 300 mm diameter substrate. The system that included the RPCVD chamber was a horizontal, single-wafer, multi-chamber system, including two load-lock chambers, a transfer chamber, and two process modules each including a process chamber. One of the two process chambers was the PPCVD chamber. The load-lock chambers were located before the transfer chamber to maintain a clean inert environment for transferring wafers in and out of the system. Each load-lock chamber was configured to hold up to 25 wafers.

In the process module including the RPCVD chamber (which is herein referred to as the "RPCVD module"), upper and lower lamp modules were used to radiantly heat the wafer and a susceptor through upper and lower quartz domes, which are parts of an enclosure in which the wafer is loaded for selective deposition. The temperature of the wafer was controlled by optical pyrometers and a closed loop proportional, integral, and derivative (PID) control system. The RPCVD chamber was configured to rotate the wafer and the susceptor during the selective deposition process during the selective deposition process. Process gases were flowed across, and over, the front surface of the wafer upon entering the process chamber at one side of the chamber, and exited the process chamber through an exhaust manifold located at the other side of the chamber.

In a first series of runs, the process module was equipped with liquid precursor delivery systems to provide vapors derived from liquid precursors into the RPCVD chamber through mass flow controllers (MFC's). Semiconductor films were deposited on both blanket silicon (001) substrates and patterned silicon (001) substrates. The blanket and patterned silicon (001) substrate had a light p-type doping corresponding to a resistivity of 7~10 Ω-cm. The deposition temperatures were set at 550° C., and the pressure during the deposition process was varies between 2 Torr and 40 Torr.

Liquid vapor high order silanes ($Si_nH_{2n+2}$; n>3) were selected as the silicon source gas to achieve high growth rate at low temperature. The precursor vapor was delivered from a bubbler to the RPCVD chamber employing a hydrogen carrier gas. Germane ($GeH_4$) diluted at 10% in hydrogen gas was used as the Ge source gas for silicon germanium alloy samples. An etch chemistry employing hydrogen chloride (HCl) and germane ($GeH_4$) was employed at 550° C., which was selected to be the same temperature as the deposition temperature for the boron-doped semiconductor.

Figure 3:
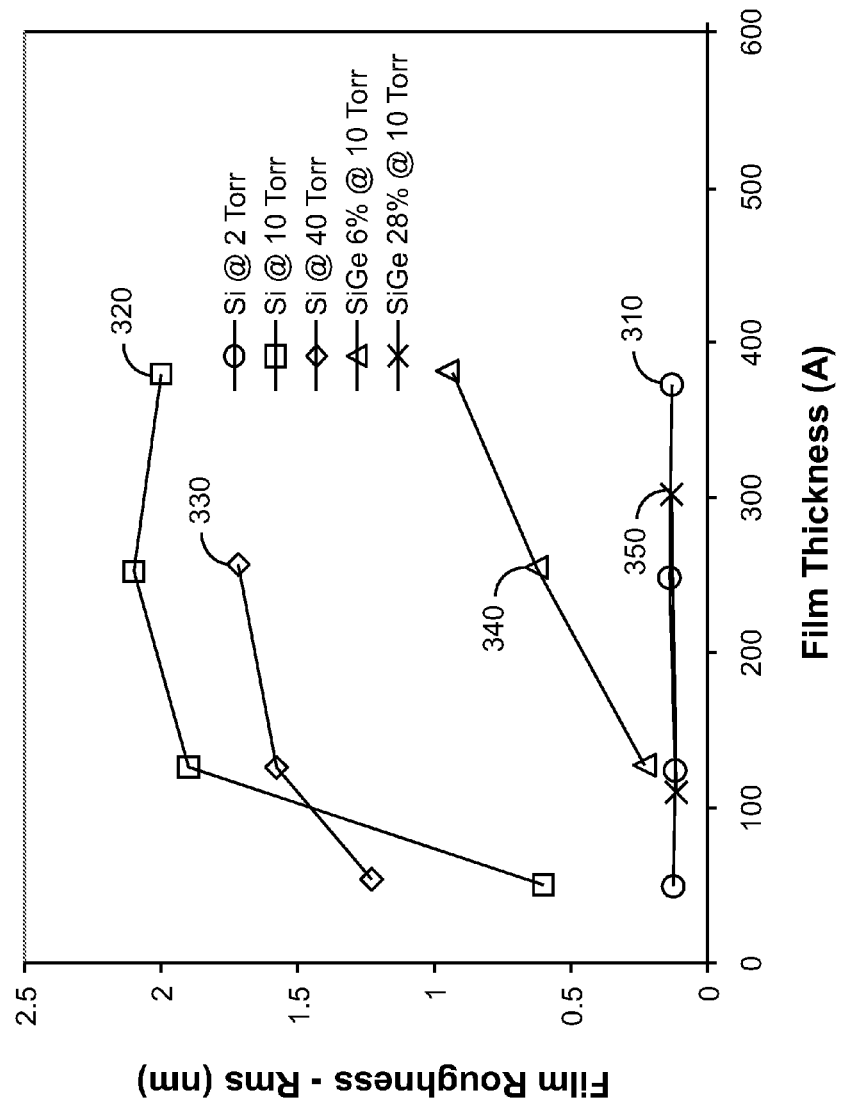
FIG. 3 shows the data on the root mean square (RMS) roughness of various films deposited by an epitaxial process employing tetrasilane as a precursor.
Figure 4:
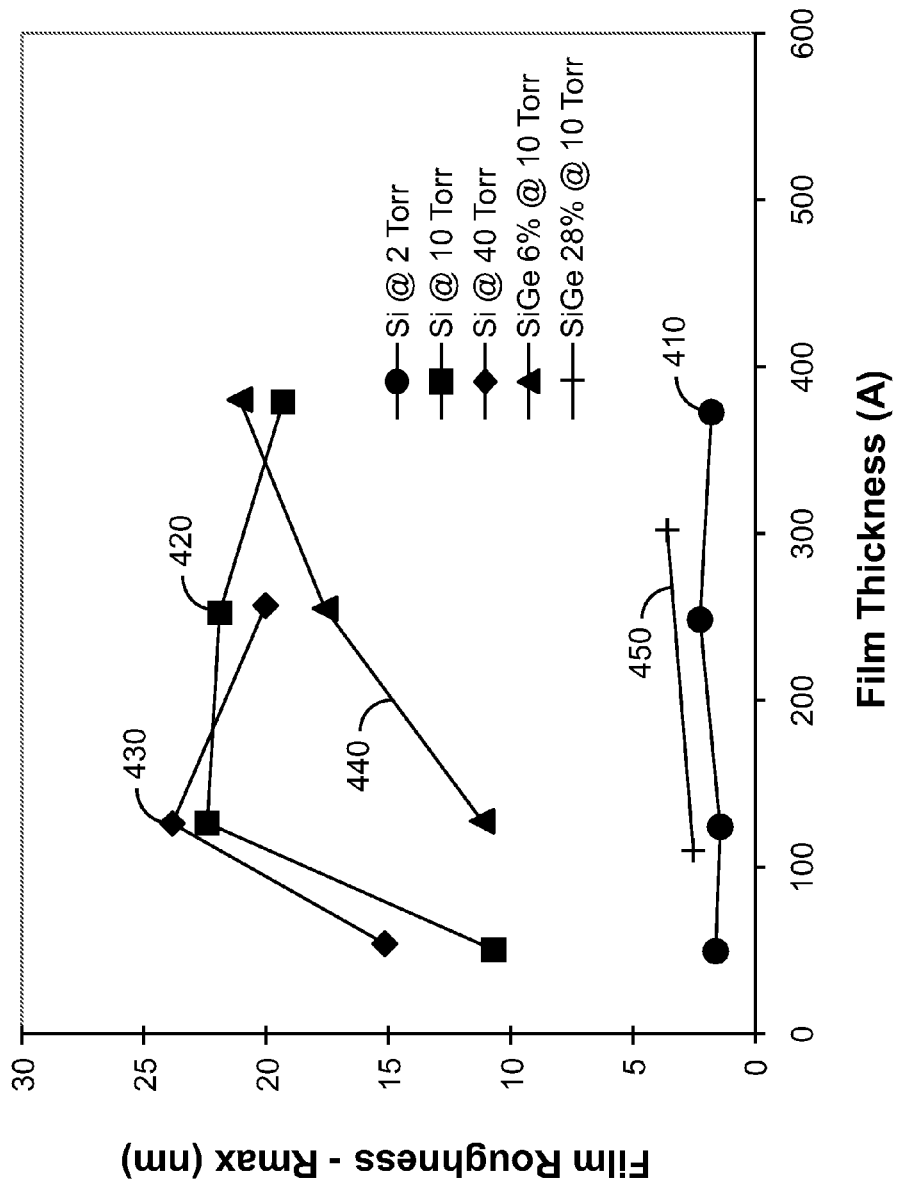
FIG. 4 shows the data on the maximum roughness of various films deposited by an epitaxial process employing tetrasilane as a precursor.

FIG. 3 and FIG. 4 show the film thickness data measured by atomic force microscopy (AFM) from five sets of samples grown in the first series of runs. FIG. 3 shows root mean square roughness data for the five sets of samples, and FIG. 4 shows maximum surface roughness within the measured areas of each sample, which is about 1 micron by 1 micron.

The first set of samples labeled "Si @ 2 Torr" refer to a set of samples including an epitaxial single crystalline silicon film that was deposited on a blanket single crystalline (001) silicon substrate and having various thicknesses. The second set of samples labeled "Si @ 10 Torr" refers to a set of samples including a silicon film that was deposited on a blanket single crystalline (001) silicon substrate and having various thicknesses. The crystallinity of the samples in the second set is believed to be predominantly epitaxial with a high concentration of crystalline defects. The third set of samples labeled "Si @ 40 Torr" refers to a set of samples including a silicon film that was deposited on a blanket single crystalline (001) silicon substrate and having various thicknesses. The crystallinity of the samples in the third set is believed to be predominantly epitaxial with a high concentration of crystalline defects. The fourth set of samples labeled "SiGe 6% @ 10 Torr" refers to a set of samples including an epitaxial single crystalline silicon germanium alloy film that was deposited on a blanket single crystalline (001) silicon substrate and having various thicknesses. The films in the fourth set include a lesser level of crystalline defects than the samples having a comparable thickness in the second and third sets. The fifth set of samples labeled "SiGe 28% @ 10 Torr" refers to a set of samples including an epitaxial single crystalline silicon germanium alloy film that was deposited on a blanket single crystalline (001) silicon substrate and having various thicknesses.

The defect level of the various sets of samples can be estimated by the root mean square roughness data shown in FIG. 3 and the maximum roughness data shown in FIG. 4. Data corresponding to the first set of samples is summarized by a first curve 310 in FIG. 3 and a first curve 410 in FIG. 4. Data corresponding to the second set of samples is summarized by a second curve 320 in FIG. 3 and a second curve 420 in FIG. 4. Data corresponding to the third set of samples is summarized by a third curve 330 in FIG. 3 and a third curve 430 in FIG. 4. Data corresponding to the fourth set of samples is summarized by a fourth curve 340 in FIG. 3 and a fourth curve 440 in FIG. 4. Data corresponding to the fifth set of samples is summarized by a fifth curve 350 in FIG. 3 and a fifth curve 450 in FIG. 4.

Data in FIGS. 3 and 4 indicates the growth mode of the various sets of samples. The first set of samples and the fifth set of samples were deposited in the FM growth mode, i.e., in a layer by layer deposition mode without crystalline defects. The second and third sets of samples were deposited in a deposition mode other than the FM growth mode, which may be the SK growth mode or possibly a polycrystalline deposition mode. The fourth sets of samples seem to have been deposited in the FM growth mode up to the thickness of about 12 nm, above which the SK growth mode may have taken over during the deposition process.

The epitaxial single crystalline silicon films in the first set of samples were deposited at a deposition rate of about 10 nm/min and consist essentially of single crystalline silicon. The silicon films in the second set of samples were deposited at a deposition rate of about 30 nm/min and consist essentially of crystalline silicon with embedded crystalline defects. The silicon films in the third set of samples were deposited at a deposition rate of about 60 nm/min and consist essentially of crystalline silicon with embedded crystalline defects. The epitaxial single crystalline silicon germanium alloy films in the fourth and fifth sets of samples were deposited at a deposition rate of about 30 nm/min or more, and consist essentially of single crystalline silicon germanium alloy material. The fourth set of samples are believed to include crystalline defects, and the fifth set of samples do not include crystalline defects.

In this example, the process conditions of a total pressure of 10 Torr and 550° C. represents an exemplary process condition in which flowing a high order silane gas for deposition of a silicon film on a single crystalline silicon substrate results in growth of silicon in a growth mode other than the FM growth mode. The lack of the FM growth mode is apparent for all samples in the second set of samples, which have a thickness of at least 5 nm. Flowing a germanium precursor gas at a sufficiently high concentration at the process conditions of a total pressure of 10 Torr and 550° C. can induce the deposition of a single crystalline silicon germanium alloy material on a single crystalline silicon substrate or a single crystalline silicon germanium alloy substrate in the FM growth mode as illustrated by the surface roughness data of the fifth set of samples.

Thus, the processes of the present disclosure includes an epitaxial silicon germanium deposition process employing a deposition step in which a combination of a high order silane and a germanium precursor are flowed into a process chamber at a total pressure and a deposition temperature at which flowing the high order silane gas without concurrent flow of any germanium precursor gas results in growth of silicon in a growth mode other than the FM growth mode. The total pressure for such processes can be in a range from 5 Torr to 300 Torr. In one embodiment, the total pressure can be in a range from 5 Torr to 40 Torr. The deposition temperature range can be from 380° C. to 600° C. In one embodiment, the deposition temperature range can be from 380° C. to 400° C. In another embodiment, the deposition temperature range can be from 400° C. to 450° C. In yet another embodiment, the deposition temperature range can be from 450° C. to 500° C. In still another embodiment, the deposition temperature range can be from 500° C. to 550° C. In even another embodiment, the deposition temperature range can be from 550° C. to 600° C.

In a second series or runs and a third series or runs, the process module was equipped with liquid precursor delivery systems to provide vapors derived from liquid precursors into the RPCVD chamber through mass flow controllers (MFC's). Semiconductor films were deposited on both blanket silicon (001) substrates and patterned silicon (001) substrates. The blanket and patterned silicon (001) substrate had a light p-type doping corresponding to a resistivity of 7~10 Ω-cm. The deposition temperatures were set at 380° C. and 400° C., respectively, and the pressure during the deposition process was 10 Torr.

Liquid vapor high order silanes ($Si_nH_{2n+2}$; n>3) were selected as the silicon source gas to achieve high growth rate at low temperature. The precursor vapor was delivered from a bubbler to the RPCVD chamber employing a hydrogen carrier gas. Germane (GeH$_4$) diluted at 10% in hydrogen gas was used as the Ge source gas. Boron dopant was introduced into the RPCVD chamber by flowing 1% diborane (B$_2$H$_6$) in hydrogen gas to the RPCVD chamber. An etch chemistry employing hydrogen chloride (HCl) and germane (GeH$_4$) was employed at 380° C. or 400° C., which was selected to be the same temperature as the deposition temperature for the boron-doped semiconductor.

In a second series of runs, tetrasilane (Si$_4$H$_{10}$) gas was delivered as a silicon-containing precursor gas at a flow rate of 29 mg/min, germane (GeH$_4$) gas was delivered as a germanium precursor gas at a flow rate of 280 sccm, 10% diborane in hydrogen was delivered as a dopant gas at a flow rate of 100 sccm, resulting in deposition of an epitaxial silicon germanium alloy at a growth rate of 9.0 nm/min at 380° C. and at a growth rate of 9.5 nm/min at 400° C., respectively. Secondary ion mass spectroscopy measurement on deposited boron-doped epitaxial silicon germanium alloy film shows that the atomic concentration of germanium was 7.0% and 8.35% for the deposition temperatures of 380° C. and 400° C., respectively.

In a third series of runs, tetrasilane (Si$_4$H$_{10}$) gas was delivered as a silicon-containing precursor gas at a flow rate of 29 mg/min, germane (GeH$_4$) gas was delivered as a germanium precursor gas at a flow rate of 800 sccm, 10% diborane in hydrogen was delivered as a dopant gas at a flow rate of 100 sccm, resulting in deposition of an epitaxial silicon germanium alloy at a growth rate of 9.1 nm/min at 380° C. and at a growth rate of 10.9 nm/min at 400° C., respectively. Secondary ion mass spectroscopy measurement on deposited boron-doped epitaxial silicon germanium alloy film shows that the atomic concentration of germanium was 19% and 21% for the deposition temperatures of 380° C. and 400° C., respectively.

Due to the non-selective nature of deposition from high-order silanes as defined above, selective deposition on patterned wafers was achieved using an isothermal cyclic deposit and etch (CDE) process at 380° C. or 400° C. This isothermal process avoided cycling to higher temperature from deposition for the etch steps, and thus, was advantageous for providing high throughput and maintaining the strain in the deposited film by minimizing exposure to an elevated temperature during the etch steps.

During each etch step, 350 sccm of HCl gas was delivered into the process chamber. In addition, germane (GeH$_4$) gas was delivered as a germanium-containing gas at a flow rate of 300 sccm. The measured etch rate depended on the temperature and the germanium concentration of the boron-doped epitaxial silicon germanium alloy films. At 380° C., the etch rates were 2.1 nm/min for the boron-doped epitaxial silicon germanium alloy film with 7.0% germanium in atomic concentration, and 2.0 nm/min for the boron-doped epitaxial silicon germanium alloy film with 19% germanium in atomic concentration. At 400° C., the etch rates were 1.0 nm/min for the boron-doped epitaxial silicon germanium alloy film with 8.35% germanium in atomic concentration, and 1.7 nm/min for the boron-doped epitaxial silicon germanium alloy film with 21% germanium in atomic concentration.

The thickness and the substitutional Ge concentration in the epitaxial boron-doped semiconductor films were determined by high-resolution X-ray diffraction (XRD) data along the (004) direction. Secondary ion mass spectrometry (SIMS) measurements were performed to determine the total boron concentration and the total germanium concentration in the epitaxial boron-doped semiconductor films. A 500 eV O$_2^+$ beam was used to collect boron and germanium depth profiling information. Boron concentration was quantified with boron implant standards in silicon, and was subsequently corrected for the yield difference due to the germanium concentration. Germanium was quantified with a set of semiconductor samples and implant standards. Within error limits, the germanium concentration measured from SIMS matched the germanium concentration calculated by XRD. The measured germanium concentrations indicated a fully-strained semiconductor layer. Taping mode atomic force microscopy (AFM) was employed to study the surface roughness of the epitaxial boron-doped semiconductor films. The film quality and morphology were investigated by cross-sectional TEM.

In the second series of runs, in-situ boron doped silicon germanium material portions were selectively deposited on silicon surfaces by performing a sequence of processing steps multiple times. The sequence included a deposition step, a first purge step in which only hydrogen was flown into a processing chamber, an etch step, and a second purge step in which only hydrogen was flown into the processing chamber. The duration of each purge step was 1 minute. The number of repetition for the sequence was 8 or 20. A net deposition thickness for the in-situ boron doped silicon germanium epitaxial film per each sequence of processing steps was about 1.1 nm per sequence at 380° C., and in a range from 2.6 nm per sequence to 3.3 nm per sequence at 380° C.

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A method of depositing a semiconductor alloy material including at least silicon and germanium comprising performing cycles of alternating deposition steps and etch steps, wherein each of said deposition steps deposits a semiconductor alloy material including at least silicon and germanium on a substrate by flowing a high order silane gas having a chemical formula of Si$_n$H$_{2n+2}$ and a germanium precursor gas as reactant gases into a process chamber including said substrate, wherein n is an integer greater than 3, and each of said etch steps etches at least a portion of said deposited semiconductor alloy material by flowing a combination of a hydrogen chloride gas and a germanium-containing gas into said process chamber.

2. The method of claim 1, wherein said each of said deposition steps is performed at a deposition temperature not less than 380° C. and less than 400° C.

3. The method of claim 2, wherein said each of said etch steps is performed at an etch temperature not less than 380° C. and not greater than 430° C.

4. The method of claim 1, wherein said each of said deposition steps is performed at a deposition temperature in a range from, and including, 380° C. to, and including, 600° C.

5. The method of claim 4, wherein said each of said etch steps is performed at an etch temperature in a range from, and including, 380° C. to, and including, 630° C.

6. The method of claim 5, wherein said etch temperature is the same as the deposition temperature.

7. The method of claim 5, wherein said etch temperature is higher than said deposition temperature.

8. The method of claim 7, wherein said etch temperature is higher than said deposition temperature by no more than 50° C.

9. The method of claim 1, wherein said germanium-containing gas is a germanium hydride.

10. The method of claim 1, wherein said germanium-containing gas is germanium chloride.

11. The method of claim 1, wherein said germanium-containing gas is germanium fluoride.

12. The method of claim 1, wherein said germanium-containing gas is selected from germane, digermane, germanium tetrachloride, and germanium tetrafluoride.

13. The method of claim 1, wherein said germanium-containing gas is the same as said germanium precursor gas.

14. The method of claim 1, wherein said germanium-containing gas is different from said germanium precursor gas.

15. The method of claim 1, wherein said semiconductor alloy material is deposited on said substrate during said each of said deposition steps within said process chamber at a pressure selected from a pressure range from 3 Torr to 300 Torr.

16. The method of claim 1, wherein said deposited semiconductor alloy material is etched during said each of said etch steps within said process chamber at a pressure selected from a pressure range from 1 Torr to 300 Torr.

17. The method of claim 1, wherein said each of said deposition steps is performed at a total pressure and a deposition temperature at which flowing said high order silane gas without concurrent flow of any germanium precursor gas results in growth of silicon in a growth mode other than a Frank-van der Merwe (FM) growth mode, and deposition of a single crystalline semiconductor alloy material in an FM growth mode occurs within said each of said deposition steps.

18. The method of claim 1, wherein said each of said deposition steps is performed at a deposition rate ranging from 1 nm/min to 30 nm/min, and wherein each of said etch steps is performed at a etch rate ranging from 1 nm/min to 100 nm/min.

19. The method of claim 1, further comprising flowing hydrogen chloride into said process chamber during said each of said deposition steps to improve a quality of said deposited semiconductor alloy material.

* * * * *